(12) United States Patent
Sharpless et al.

(10) Patent No.: US 8,540,843 B2
(45) Date of Patent: *Sep. 24, 2013

(54) PLASMA CHAMBER TOP PIECE ASSEMBLY

(75) Inventors: Leonard J. Sharpless, Fremont, CA (US); Keith Comendant, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 202 days.

This patent is subject to a terminal disclaimer.

(21) Appl. No.: 12/861,769

(22) Filed: Aug. 23, 2010

(65) Prior Publication Data

US 2012/0043022 A1 Feb. 23, 2012

Related U.S. Application Data

(63) Continuation of application No. 10/883,287, filed on Jun. 30, 2004, now Pat. No. 7,780,791.

(51) Int. Cl.
*C23C 16/00* (2006.01)
*C23F 1/00* (2006.01)
*H01L 21/306* (2006.01)

(52) U.S. Cl.
USPC ............ 156/345.37; 156/345.48; 156/345.49; 118/723 I; 118/723 IR; 118/723 R; 118/723 AN; 118/724; 315/111.51

(58) Field of Classification Search
USPC ........ 156/345.37, 345.48, 345.49; 118/723 I, 118/723 IR, 723 R, 723 AN; 315/111.51
See application file for complete search history.

(56) References Cited

U.S. PATENT DOCUMENTS

| 4,518,848 A | 5/1985 | Weber |
| 5,456,793 A | 10/1995 | Myers |

(Continued)

FOREIGN PATENT DOCUMENTS

| CN | 1221460 A | 6/1999 |
| WO | WO-97-47022 | 12/1997 |

OTHER PUBLICATIONS

"Office Action", Taiwan Patent Application No. 094121495, Mailing Date: Dec. 30, 2011.

(Continued)

*Primary Examiner* — Rakesh Dhingra
(74) *Attorney, Agent, or Firm* — Klintworth & Rozenblat IP LLC (57) ABSTRACT

A plasma processing system for processing a substrate is described. The plasma processing system includes a bottom piece including a chuck configured for holding the substrate. The plasma processing system also includes an induction coil configured to generate an electromagnetic field in order to create a plasma for processing the substrate. The plasma processing system also includes a cover covering at least the induction coil and a heating and cooling system. The top piece coupled to the bottom piece and at least partially covered by the cover, the top piece comprising a first shelf, a second shelf, and a wall; the wall being disposed between the first shelf and the second shelf; a cavity being formed between the first shelf and the second shelf, and between the wall and a portion of the cover; the heating and cooling system being disposed inside the cavity; Wherein, the heating and cooling system is substantially shielded from the electromagnetic field by the top piece, and the top piece substantially complies with a set of SEMI ergonomic safety standards for a part handled by a single person.

20 Claims, 4 Drawing Sheets

(56) References Cited

U.S. PATENT DOCUMENTS

| | | | |
|---|---|---|---|
| 5,492,569 A | 2/1996 | Nakada | |
| 5,589,737 A * | 12/1996 | Barnes et al. | 315/111.21 |
| 5,802,856 A | 9/1998 | Schaper et al. | |
| 5,863,376 A | 1/1999 | Wicker et al. | |
| 5,874,012 A | 2/1999 | Kanai et al. | |
| 5,875,096 A | 2/1999 | Gates | |
| 5,961,850 A | 10/1999 | Satou et al. | |
| 6,016,765 A | 1/2000 | Numasawa et al. | |
| 6,074,953 A | 6/2000 | Donohoe et al. | |
| 6,110,556 A | 8/2000 | Bang et al. | |
| 6,123,775 A | 9/2000 | Hao et al. | |
| 6,178,918 B1 | 1/2001 | Van Os et al. | |
| 6,228,634 B1 | 5/2001 | Blumenfeld et al. | |
| 6,302,966 B1 | 10/2001 | Bailey, III et al. | |
| 6,308,654 B1 | 10/2001 | Schneider et al. | |
| 6,403,933 B1 | 6/2002 | Strodtbeck et al. | |
| 6,537,417 B2 | 3/2003 | Kojima et al. | |
| 6,572,732 B2 | 6/2003 | Collins et al. | |
| 6,603,234 B2 | 8/2003 | Heyden et al. | |
| 6,666,924 B1 | 12/2003 | van Bilsen et al. | |
| 6,811,651 B2 | 11/2004 | Long | |
| 6,939,579 B2 | 9/2005 | Bondestam et al. | |
| 6,951,821 B2 | 10/2005 | Hamelin et al. | |
| 7,079,760 B2 | 7/2006 | Hamelin et al. | |
| 7,223,321 B1 | 5/2007 | Comendant et al. | |
| 7,311,782 B2 | 12/2007 | Strang et al. | |
| 2001/0018951 A1* | 9/2001 | Masuda et al. | 156/345 |
| 2002/0007795 A1 | 1/2002 | Bailey et al. | |
| 2002/0093148 A1 | 7/2002 | Golovato et al. | |
| 2003/0213434 A1 | 11/2003 | Gondhalekar et al. | |
| 2004/0007178 A1 | 1/2004 | Forrest et al. | |
| 2005/0269030 A1 | 12/2005 | Kent et al. | |
| 2006/0000413 A1 | 1/2006 | Sharpless et al. | |
| 2006/0000551 A1 | 1/2006 | Saldana et al. | |
| 2010/0175831 A1* | 7/2010 | Sasaki | 156/345.48 |

OTHER PUBLICATIONS

"Final Office Action", U.S. Appl. No. 10/882,464, Mailing Date: Mar. 1, 2007.
"International Search Report", Application No. PCT/US05/21202, Mailed: Jul. 3, 2006.
"Written Opinion", Application No. PCT/US05/21202, Mailed: Jul. 3, 2006.
"International Preliminary Report on Patentability", Application No. PCT/US2005/021202, Mailed: Jan. 9, 2007.
"International Preliminary Report on Patentability", Application No. PCT/US2005/020968, Mailed: Jan. 18, 2007.
"Final Office Action", U.S. Appl. No. 10/883,287, Mailing Date: Apr. 19, 2007.
"Non Final Office Action", U.S. Appl. No. 10/883,287, Mailing Date: Dec. 13, 2007.
"Final Office Action", U.S. Appl. No. 10/883,287, Mailing Date: Jul. 24, 2008.
"Non Final Office Action", U.S. Appl. No. 10/883,287, Mailing Date: Dec. 23, 2008.
"Thermal Mass", Power Point Presentation, No author information, 21 total pages.
"Environmental, Health, and Safety Guidelines for Semiconductor Manufacturing Equipment", (SEMI S8-0701), 1995, www.semi.org.
"Safety Guidelines for Ergonomics Engineering of Semiconductor Manufacturing Equipment", (SEMI S8-0701), 1995, www.semi.org.
"SEMI Draft Doc. #3814: New Standard: Safety Guideline for FPD Manufacturing System", 47 Total Pages.
"Final Office Action", U.S. Appl. No. 10/883,287, Mailing Date: Apr. 29, 2009.
"Non Final Office Action", U.S. Appl. No. 10/883,287, Mailing Date: Oct. 6, 2009.
"Final Office Action", U.S. Appl. No. 10/883,287, Mailing Date: Jan. 25, 2010.
"First Office Action", Issued in CN Application No. 200580027668.4, Mailing Date: Mar. 21, 2008.
"Second Office Action", Issued in CN Application No. 200580027668.4, Mailing Date: Nov. 7, 2008.
"AU Written Opinion", Issued in Application No. SG 2006-09053-4, Mailing Date: Apr. 21, 2008.
"Reexamination", Issued in Chinese Application No. 200580027668.4; Mailing Date: Sep. 7, 2010.
"First Notice of Preliminary Rejection", Korean Patent Application No. 2007-7002370, Mailing Date: Aug. 31, 2011.
"Final Notification of Reasons of Refusal", Japan Application No. 2007-519251, Mailing Date: Nov. 15, 2011.
"Decision of Reexamination", Issued in Chinese Application No. 200580027268.4; Mailing Date: Jan. 20, 2011.
"Notification of Reasons of Refusal", Japan Application No. 2007-519251, Mailing Date: Mar. 29, 2011.
"Non Final Office Action", U.S. Appl. No. 10/882,464, Mailing Date: Jun. 28, 2006.
"Non Final Office Action", U.S. Appl. No. 10/882,464, Mailing Date: Jul. 12, 2007.
"Final Office Action", U.S. Appl. No. 10/882,464, Mailing Date: Oct. 17, 2007.
"Final Office Action", U.S. Appl. No. 10/882,464, Mailing Date: Mar. 2, 2007.
"International Search Report", Application Number: PCT/US05/20968, Mailed: Jul. 3, 2006.
"Written Opinion", Application Number: PCT/US05/20968, Mailed: Jul. 3, 2006.
"International Preliminary Report on Patentability", Application Number: PCT/US2005/021202, Mailed: Jan. 9, 2007.
"International Preliminary Report on Patentability", Application Number: PCT/US2005/020968, Mailed: Jan. 18, 2007.
"Non Final Office Action", U.S. Appl. No. 10/883,287, Mailing Date: Jun. 28, 2006.

* cited by examiner

PLASMA CHAMBER TOP PIECE ASSEMBLY

REFERENCE TO RELATED APPLICATIONS

This application incorporates by reference U.S. Ser. No. 10/232,564 (LAM2P364/P0990) filed on Aug. 30, 2002.

PRIORITY CLAIM

The present application is a continuation under 37 CFR 1.53(b) and claims priority under 35 USC 120 to U.S. non-provisional patent application Ser. No. 10/883,287, filed Jun. 30, 2004, now U.S. Pat. No. 7,780,791, entitled "APPARATUS FOR AN OPTIMIZED PLASMA CHAMBER TOP PIECE".

BACKGROUND OF THE INVENTION

The present invention relates in general to substrate manufacturing technologies and in particular to an apparatus for an optimized plasma chamber top piece.

In the processing of a substrate, e.g., a semiconductor substrate or a glass panel such as one used in flat panel display manufacturing, plasma is often employed. As part of the processing of a substrate for example, the substrate is divided into a plurality of dies, or rectangular areas, each of which will become an integrated circuit. The substrate is then processed in a series of steps in which materials are selectively removed (etching) and deposited (deposition) in order to form electrical components thereon.

In an exemplary plasma process, a substrate is coated with a thin film of hardened emulsion (i.e., such as a photoresist mask) prior to etching. Areas of the hardened emulsion are then selectively removed, causing components of the underlying layer to become exposed. The substrate is then placed in a plasma processing chamber on a substrate support structure comprising a mono-polar or bi-polar electrode, called a chuck or pedestal. Appropriate etchant source are then flowed into the chamber and struck to form a plasma to etch exposed areas of the substrate.

Figure 1:
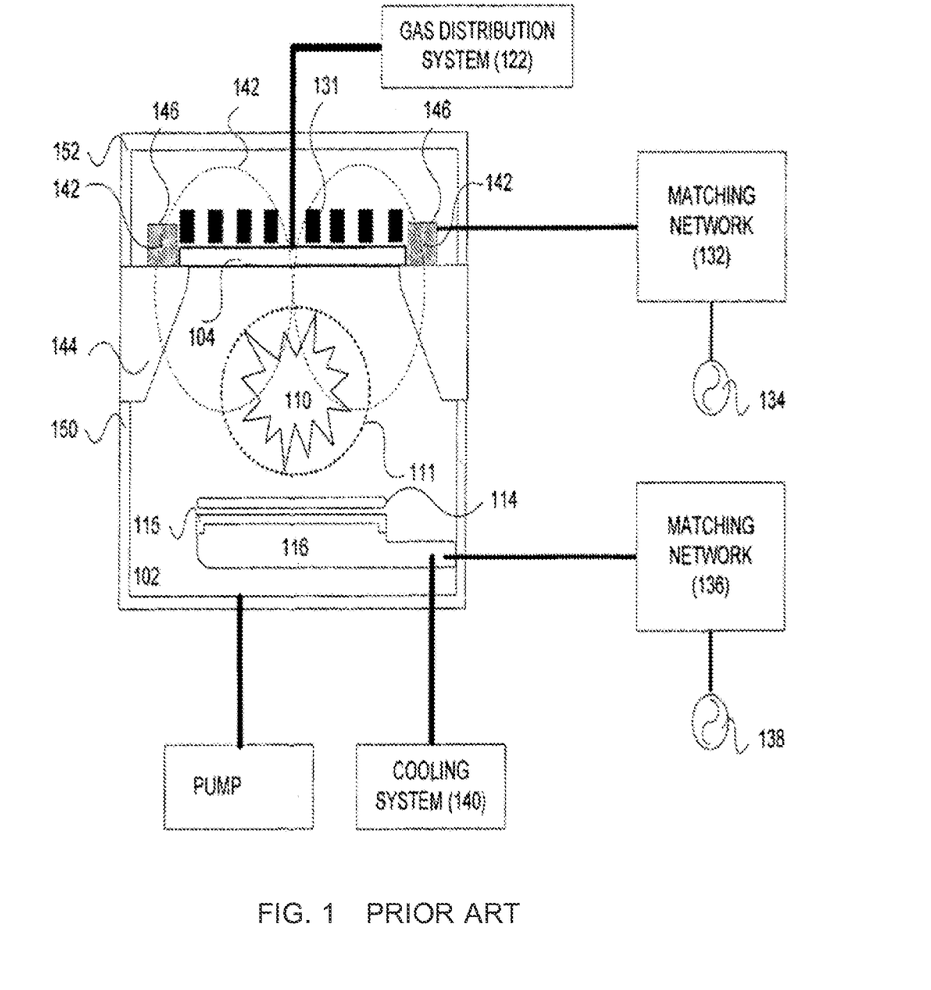
FIG. 1 shows a simplified diagram of a plasma processing system.

Referring now to FIG. 1, a simplified diagram of inductively coupled plasma processing system components is shown. Generally, the plasma chamber (chamber) 102 is comprised of a bottom piece 150, a top piece 144, and a top piece cover 152. An appropriate set of gases is flowed into chamber 102 from gas distribution system 122. These plasma processing gases may be subsequently ionized to form a plasma 110, in order to process (e.g., etch or deposition) exposed areas of substrate 114, such as a semiconductor substrate or a glass pane, positioned with edge ring 115 on an electrostatic chuck (chuck) 116. Gas distribution system 122 is commonly comprised of compressed gas cylinders (not shown) containing plasma processing gases (e.g., $C_4F_8$, $C_4F_6$, $CHF_3$, $CH_2F_3$, $CF_4$, $HBr$, $CH_3F$, $C_2F_4$, $N_2$, $O_2$, $Ar$, $Xe$, $He$, $H_2$, $NH_3$, $SF_6$, $BCl_3$, $Cl_2$, $WF_6$, etc.).

Induction coil 131 is separated from the plasma by a dielectric window 104, and generally induces a time-varying electric current in the plasma processing gases to create plasma 110. The window both protects induction coil from plasma 110, and allows the generated RF field 142 to generate an inductive current 111 within the plasma processing chamber. Further coupled to induction coil 131 is matching network 132 that may be further coupled to RF generator 134. Matching network 132 attempts to match the impedance of RF generator 134, which typically operates at about 13.56 MHz and about 50 ohms, to that of the plasma 110. Additionally, a second RF energy source 138 may also be coupled through matching network 136 to the substrate 114 in order to create a bias with the plasma, and direct the plasma away from structures within the plasma processing system and toward the substrate.

Generally, some type of cooling system 140 is coupled to chuck 116 in order to achieve thermal equilibrium once the plasma is ignited. The cooling system itself is usually comprised of a chiller that pumps a coolant through cavities in within the chuck, and helium gas pumped between the chuck and the substrate. In addition to removing the generated heat, the helium gas also allows the cooling system to rapidly control heat dissipation. That is, increasing helium pressure subsequently also increases the heat transfer rate. Most plasma processing systems are also controlled by sophisticated computers comprising operating software programs. In a typical operating environment, manufacturing process parameters (e.g., voltage, gas flow mix, gas flow rate, pressure, etc.) are generally configured for a particular plasma processing system and a specific recipe.

In addition, a heating and cooling plate 146 may operate to control the temperature of the top piece 144 of the plasma processing apparatus 102 such that the inner surface of the top piece 144, which is exposed to the plasma during operation, is maintained at a controlled temperature. The heating and cooling plate 146 is formed by several different layers of material to provide both heating and cooling operations.

The top piece itself is commonly constructed from plasma resistant materials that either will ground or are transparent to the generated RF field within the plasma processing system (e.g., aluminum, ceramic, etc.). Most top piece designs, however, are optimized for operational performance within the chamber itself, and not for other considerations such as ergonomic safety or general thermal performance.

For example, the existing upper portion of the 2300 plasma etch chamber is a monolithic piece of aluminum weighing about 75 lbs, making it substantially difficult to handle during removal, installation, and cleaning. It generally requires at least two workers using some type of lifting apparatus (i.e., winch, etc.) to safely remove the top piece from the plasma processing system.

Historically, since the relative manufacturing cost of the top piece was just a relatively small portion of the overall system cost, there has been no incentive to re-design with smaller amount of material, hence lighter. However, there is growing concern over worker safety, as well as the reduction of worker injuries and subsequently of worker compensation claims. That is, as plasma processing systems have become more sophisticated, many substrate manufactures are able to use fewer less skilled workers in order to save costs, increasing the likelihood of accidental injury.

For example, the *Safety Guidelines For Ergonomics Engineering Of Semiconductor Manufacturing Equipment* (SEMI S8-0701), and the *Environmental, Health, And Safety Guideline For Semiconductor Manufacturing Equipment* (SEMI S2-0302), which are both incorporated by reference, discuss design principles for the elimination or mitigation of ergonomic hazards in plasma processing systems.

In particular, ergonomic hazards should be designed out or otherwise reduced to the maximum extent practicable. Ergonomic hazards exist whenever the system design or installation results in task demands (e.g., manipulation of the top piece) that exceed the information processing and/or physical capabilities of trained personnel. In particular, equipment should be designed to fit the physical characteristics of 90% of the user population (e.g. from 5th percentile female through 95th percentile male in the country or region of use.)

Preventive maintenance is also an issue, since the relative heavy weight of the top piece makes the top piece difficult to manipulate, and hence problematic to effectively clean during scheduled maintenance. Cleaning is further aggravated by the presence of plastic and stainless materials on the top piece that limit the types of available cleaning techniques. That is, although a particular cleaning chemical may effectively clean the residue from the top piece, the same chemical may also substantially damage the plastic materials or stainless steel.

In addition, correctly reseating the top piece after maintenance is often difficult, since it must properly be aligned with the bottom piece such that a set of gaskets properly seal around the top piece. A slight misalignment will preclude a proper mating, requiring the workers to try to nudge the heavy top piece into place.

The volume of material in the top piece also tends to add a substantial thermal mass to the plasma processing system. Thermal mass refers to materials have the capacity to store thermal energy for extended periods. In general, plasma processes tend to very sensitive to temperature variation. For example, a temperature variation outside the established process window can directly affect the etch rate or the deposition rate of polymeric films, such as poly-floro-carbon, on the substrate surface. Temperature repeatability between substrates is often important, since many plasma processing recipes may also require temperature variation to be on the order of a few tenths of degree C. Because of this, the top piece is often heated or cooled in order to substantially maintain the plasma process within established parameters.

As the plasma is ignited, the substrate absorbs thermal energy, which is subsequently measured and then removed through the cooling system. However, since the top piece has a relatively large thermal mass, temperature corrections by the cooling system may not be synchronized with temperature variations in the top piece. Subsequently, heat flow variations may cause the substrate temperature to vary outside narrow recipe parameters.

In addition, the location of the heating and cooling plate 146, as shown in FIG. 1, may interfere with electromagnetic field 142. As a high frequency power is applied from the RF power generator 134 to the coil 131, an electromagnetic field is generated, which subsequently generates an inductive current 111 that creates and maintains the plasma. Although not necessarily uniform, the heating and cooling plate 146 may interfere with the electromagnetic field and subsequently affect the uniformity of plasma 110. That is, the resulting electric field may become radial distorted which may result in a substantially non-uniform plasma density across the substrate, potentially affecting yield.

This condition becomes even more problematic as requirements for high circuit density on substrates continue to escalate. For example, in a plasma etch process, if the plasma is not properly optimized, faceting may occur. A facet is a non-linear profile of a feature on the substrate, such as with a trench sidewall. A region of low plasma density may not remove a sufficient amount of material from the substrate, subsequently reducing the size of a trench or via. Likewise, a region of high plasma density may remove an excess amount of material from the substrate subsequently creating a cavernous undercut.

In view of the foregoing, there are desired methods and apparatus for optimizing a process model in a plasma processing system.

SUMMARY OF THE INVENTION

The invention relates, in one embodiment, in a plasma processing system, to an apparatus for processing a substrate. The plasma processing system includes a bottom piece including a chuck configured for holding the substrate. The plasma processing system also includes an induction coil configured to generate an electromagnetic field in order to create a plasma for processing the substrate; and an optimized top piece coupled to the bottom piece, the top piece further configured for a heating and cooling system. Wherein, the heating and cooling system is substantially shielded from the electromagnetic field by the optimized top piece, and the optimized top piece can substantially be handled by a single person.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

While not wishing to be bound by theory, it is believed by the inventor herein that an optimized top piece can be configured to substantially optimize worker ergonomic safety as well as plasma process operational characteristics.

In one embodiment, the optimized top piece comprises a weight that is approximately 80% less than the existing non-optimized top pieces.

In another embodiment, the optimized top piece comprises a heat capacity that is approximately 80% less than the existing non-optimized top pieces.

In another embodiment, the optimized top piece shields the RF field from a heating and cooling plate.

In another embodiment, the optimized top piece consists of a light weight, hard anodized, aluminum cylinder that has features for mounting process support hardware (RF input coil, alignment features, temperature control hardware, etc.), sealing vacuum and conducting electrical current out of the optimized top piece.

In another embodiment, the optimized top piece comprises a set of top and bottom vacuum seals that include o-rings.

In another embodiment, the optimized top piece comprises a metallic spring gasket that substantially fits into a groove and contacts a bare metal strip on the bottom piece in order to establish electrical conduction.

In another embodiment, the internal shape of the optimized top piece substantially matches the internal shape of a non-optimized top piece, such that electrical, gas flow, and plasma containment characteristics are substantially the same.

In another embodiment, the top piece does not substantially contain plastic or stainless steel.

In another embodiment, the top piece complies with the SEMI ergonomic safety standards for a part handled by a person.

Figure 2:
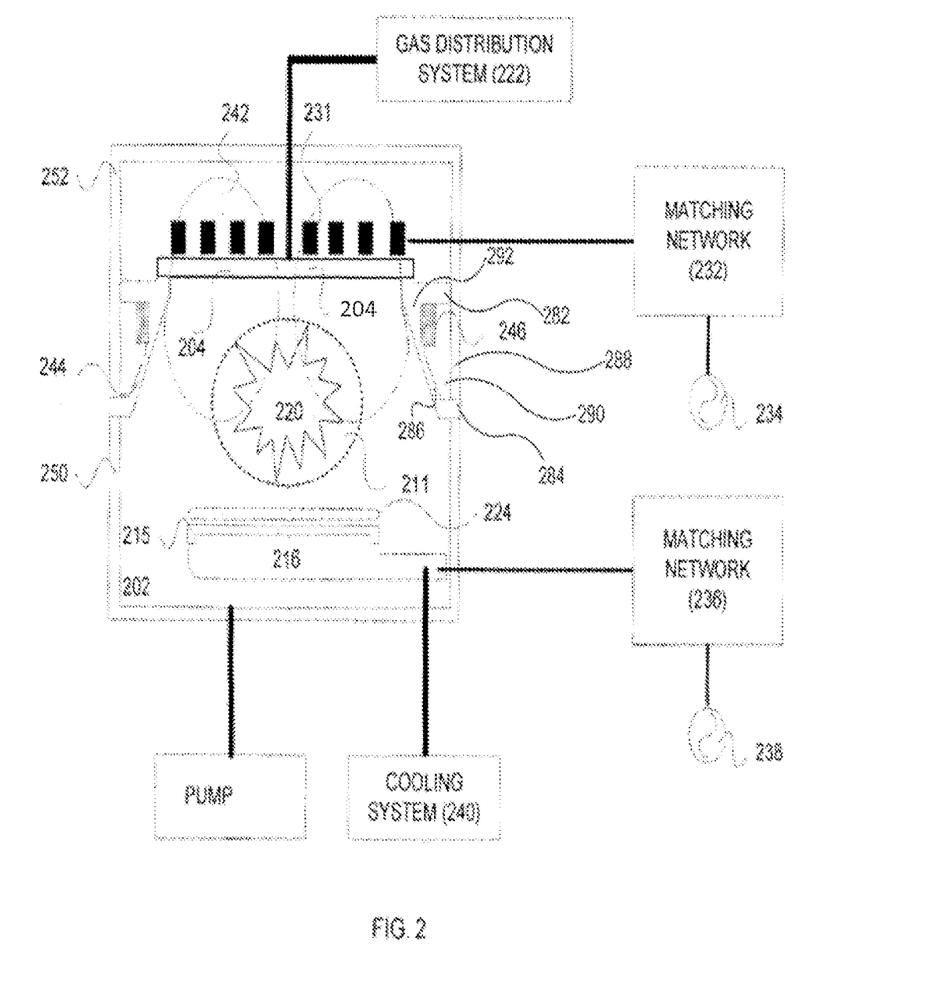
FIG. 2 shows a simplified diagram of a plasma processing system with a optimized top piece, according to one embodiment of the invention.

Referring now to FIG. 2, a simplified diagram of inductively coupled plasma processing system components with an optimized top piece is shown, according to one embodiment of the present invention. Generally, the plasma chamber (chamber) 202 is comprised of a bottom piece 250 and a top piece cover 252. However, in a non-obvious fashion, top piece 144, as shown in FIG. 1, as been replaced with an optimized top piece 244, in order to optimize worker ergonomic safety as well as plasma process operational characteristics.

The top piece itself is commonly constructed from plasma resistant materials that either will ground or are transparent to the generated RF field within the plasma processing system (e.g., aluminum, ceramic, etc.). Most top piece designs, however, are not optimized for ergonomic safety or general thermal performance.

Historically, there has generally been no motivation to optimize top piece weight, since the manufacturing cost of the top piece is generally a relatively small portion of the overall system cost. However, concern over worker safety has grown as industry is attempts to reduce worker injuries and injury-related costs. In particular, as plasma processing systems have become more sophisticated, many substrate manufactures are able to use fewer less skilled workers in order to save costs, increasing the likelihood of accidental injury. As previously explained, ergonomic hazards exist whenever the system design or installation results in task demands (e.g., manipulation of the top piece) that exceed the information processing and/or physical capabilities of trained personnel.

However, in the current invention, an optimized top piece may be approximately 80% lighter than an existing non-optimized top piece, substantially complying with SEMI ergonomic safety standards for a part handled by one person (e.g., removing, lifting, cleaning, etc.). In addition, preventive maintenance is also substantially simplified, since a single worker can easily manipulate the optimized top piece without the use of a lifting apparatus (i.e., winch, etc.), facilitating proper cleaning. In addition, correctly reseating the top piece after maintenance is also substantially simplified, since it may be easily aligned with the bottom piece such that a set of gaskets properly seal around the top piece.

The current invention also may have a thermal mass that is approximately 80% less than the existing non-optimized top pieces. As previously described, the volume of material in the top piece also tends to add a substantial thermal mass to the plasma processing system. Temperature repeatability between substrates is often important, since many plasma processing recipes may also require temperature variation to be on the order of a few tenths of degree C. Because of this, the top piece is often heated or cooled in order to substantially maintain the plasma process within established parameters. Unlike a non-optimized top piece, an optimized top piece has a relatively small thermal mass, such that temperature corrections by the cooling system may be substantially synchronized.

An appropriate set of gases is flowed into chamber 202 from gas distribution system 222. These plasma processing gases may be subsequently ionized to form a plasma 210, in order to process (e.g., etch or deposition) exposed areas of substrate 224, such as a semiconductor substrate or a glass pane, positioned with edge ring 215 on an electrostatic chuck (chuck) 226. Gas distribution system 222 is commonly comprised of compressed gas cylinders (not shown) containing plasma processing gases (e.g., $C_4F_8$, $C_4F_6$, $CHF_3$, $CH_2F_3$, $CF_4$, HBr, $CH_3F$, $C_2F_4$, $N_2$, $O_2$, Ar, Xe, He, $H_2$, $NH_3$, $SF_6$, $BCl_3$, $Cl_2$, $WF_6$, etc.).

Induction coil 231 is separated from the plasma by a dielectric window 204, and generally induces a time-varying electric current in the plasma processing gases to create plasma 220. The window both protects induction coil from plasma 220, and allows the generated RF field 242 to penetrate into the plasma processing chamber. Further coupled to induction coil 231 is matching network 232 that may be further coupled to RF generator 234. Matching network 232 attempts to match the impedance of RF generator 234, which typically operates at about 13.56 MHz and about 50 ohms, to that of the plasma 220. Additionally, a second RF energy source 238 may also be coupled through matching network 236 to the substrate 224 in order to create a bias with the plasma, and direct the plasma away from structures within the plasma processing system and toward the substrate.

Generally, some type of cooling system 240 is coupled to chuck 216 in order to achieve thermal equilibrium once the plasma is ignited. The cooling system itself is usually comprised of a chiller that pumps a coolant through cavities within the chuck, and helium gas pumped between the chuck and the substrate. In addition to removing the generated heat, the helium gas also allows the cooling system to rapidly control heat dissipation. That is, increasing helium pressure subsequently also increases the heat transfer rate. Most plasma processing systems are also controlled by sophisticated computers comprising operating software programs. In a typical operating environment, manufacturing process parameters (e.g., voltage, gas flow mix, gas flow rate, pressure, etc.) are generally configured for a particular plasma processing system and a specific recipe.

In addition, a heating and cooling plate 246, or other process related hardware, may operate to control the temperature of the top piece 244, or process conditions, of the plasma processing apparatus 202 such that the inner surface of the optimized top piece 244, which is exposed to the plasma during operation, is maintained at a controlled temperature. However, unlike a non-optimized top piece, heating and cooling plate 246, or other process related hardware, is positioned such that it is shielded from electromagnetic field 242 by the optimized top piece 244. As illustrated in the example of FIG. 2, top piece 244 may be coupled to bottom piece 250 and may be at least partially covered by top piece cover 252 that covers induction coil 231. Top piece 244 may include a first shelf 282, a second shelf 284, and a wall 286. As shown, first shelf 282 may be disposed above second shelf 284, wall 286 may be disposed between first shelf 282 and second shelf 284, and top piece cover 252 may be coupled to bottom piece 250 through second shelf 284. A cavity 290 may be formed between first shelf 282 and second shelf 284, and between wall 286 and a portion 288 of top piece cover 252. First shelf 282 may contact portion 288 of top piece cover 252. Cavity 290 also may be covered by top piece cover 252. Heating and cooling plate 246 may be disposed inside cavity 290 such that heating and cooling plate 246 is shielded from electromagnetic field 242. First shelf 282 may be connected to wall 286 at a junction 292, and heating and cooling plate 246 may be further disposed at junction 292.

As previously described, as a high frequency power is applied from the RF power generator 234 to the coil 231, an electromagnetic field 242 is generated, which subsequently generates an inductive current 211 that creates and maintains the plasma. Since optimized top piece 244 shields electromagnetic field 242 from heating and cooling plate 246, or other process related hardware, the resulting electromagnetic field 211 and hence the uniformity of plasma 220 may be better optimized. That is, the resulting electric field may become less distorted which may result in a more optimum uniform plasma density across the substrate, potentially improving yield (e.g., reducing faceting, etc.).

Figure 3A:
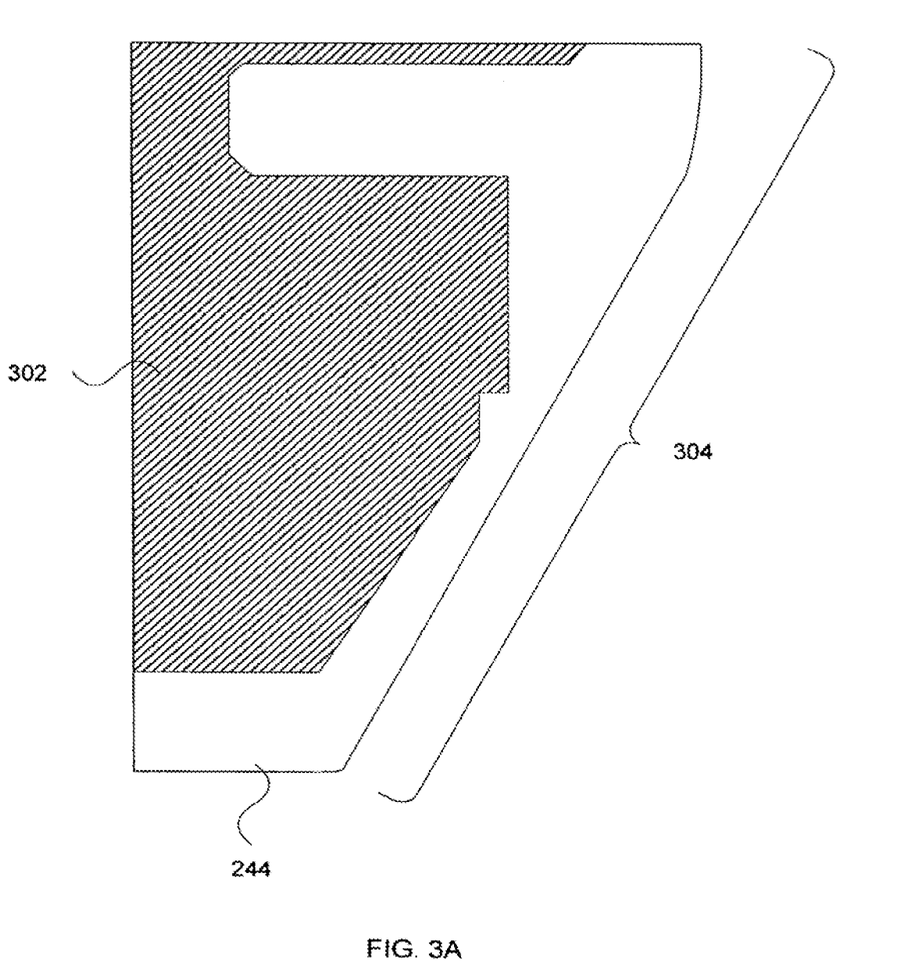
FIGS. 3A-3B show a simplified diagram of a optimized top piece, according to one embodiment of the invention.

Referring now to FIG. 3A, a simplified diagram of an optimized top piece 244 is shown, according to one embodiment of the present invention. Portion 302 represents approximately 80% of the mass of the non-optimized top piece, and is non-process critical. Since only the outer surface has been modified, the internal shape 304 substantially matches electrical, gas flow, and plasma containment characteristics of a non-optimized top piece.

Figure 3B:
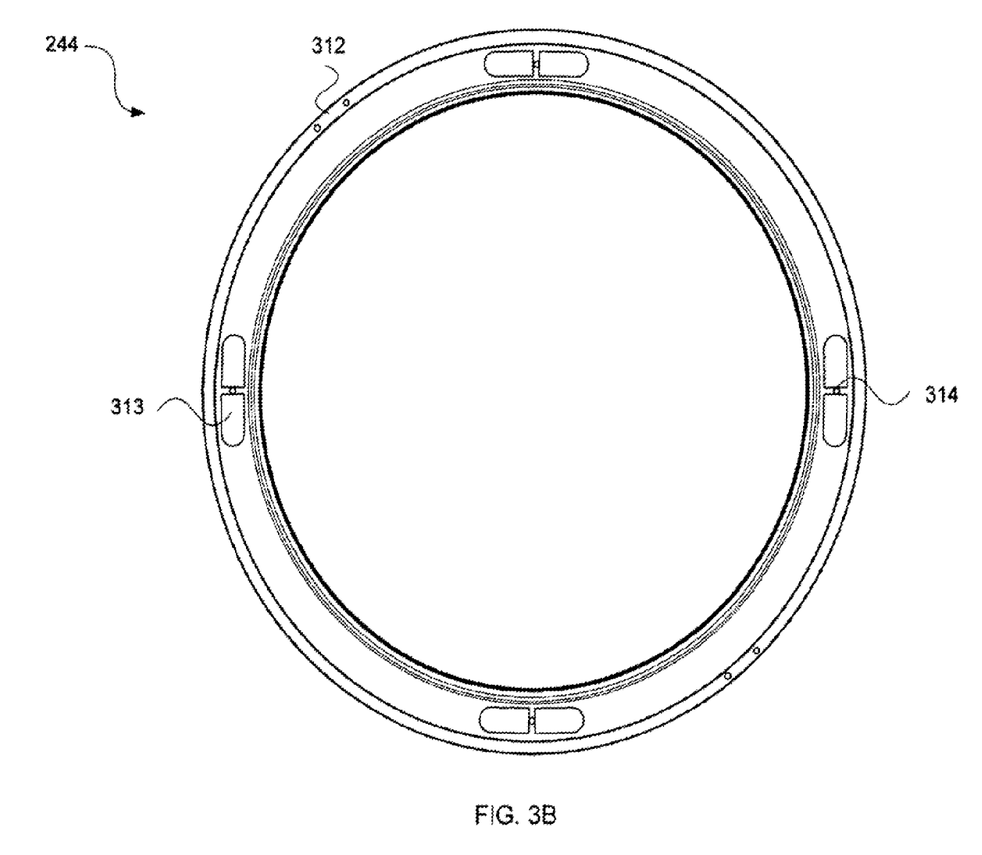

Referring now to FIG. 3B, a simplified diagram of an optimized top piece 244 is shown, according to one embodiment of the present invention. Mounting locations 312 allow the coupling of alignment brackets that may be removed during cleaning, in order to minimize part cost and cleaning solution contamination. The set of handles 313 are integrated directly into the top piece, and provide a specific point from which to pick up and handle the top piece to order to minimize operator contact with the process sensitive areas of the chamber. In addition, the set of alignment holes 314 allows for the alignment and mounting of the RF coil directly to the chamber.

While this invention has been described in terms of several preferred embodiments, there are alterations, permutations, and equivalents which fall within the scope of this invention. For example, although the present invention has been described in connection with plasma processing systems from Lam Research Corp. (e.g., Exelan™, Exelan™ HP, Exelan™ HPT, 2300™; Versys™ Star, etc.), other plasma processing systems may be used. This invention may also be used with substrates of various diameters (e.g., 200 mm, 300 mm, etc.). Also, materials other than aluminum may be used, such as ceramics.

Advantages of the invention include an apparatus for an optimized plasma chamber top piece. Additional advantages may include optimization of worker ergonomic safety and plasma process operational characteristics.

Having disclosed exemplary embodiments and the best mode, modifications and variations may be made to the disclosed embodiments while remaining within the subject and spirit of the invention as defined by the following claims.

What is claimed is:

1. A plasma processing system for processing a substrate, comprising:
   a bottom piece including a chuck configured for holding said substrate;
   an induction coil configured to generate an electromagnetic field in order to create a plasma for processing said substrate;
   a cover covering at least said induction coil;
   a heating and cooling system; and
   a top piece coupled to said bottom piece and at least partially covered by said cover, said top piece comprising a first shelf a second shelf, and a wall; said wall being disposed between said first shelf and said second shelf, a cavity being formed between said first shelf and said second shelf and between said wall and a portion of said cover; said heating and cooling system being disposed inside said cavity,
   wherein said heating and cooling system is substantially shielded from said electromagnetic field by said top piece.

2. The plasma processing system of claim 1, wherein the electromagnetic shielding of the heating and cooling system minimizes a distortion of a resulting electric field.

3. The plasma processing system of claim 2, wherein the minimized distortion of the electric field results in an improved uniformity of a density of the created plasma, and in an improved yield.

4. The plasma processing system of claim 1, wherein
   said first shelf is connected to said wall at a junction, and
   said heating and cooling system is further disposed at said junction.

5. The plasma processing system of claim 1, wherein said heating and cooling system surrounds at least a portion of said wall.

6. The plasma processing system of claim 1, wherein said cover is coupled to said bottom piece through said second shelf.

7. The plasma processing system of claim 1, wherein said top piece includes an inner surface area exposed to said plasma, where said inner surface area of said top piece is substantially the same as a non-optimized top piece.

8. The plasma processing system of claim 1, wherein said first shelf is disposed above said second shelf.

9. The plasma processing system of claim 1, wherein said first shelf contacts said portion of said cover.

10. The plasma processing system of claim 1, wherein said top piece further comprises a recess portion associated with a reduced weight that is greater than a weight of said top piece.

11. The plasma processing system of claim 1, wherein said top piece further comprises a recess portion associated with a reduced weight that is greater than or equal to 400% of a weight of said top piece.

12. The plasma process system of claim 1, wherein said top piece further comprises a recess portion associated with a reduced heat capacity that is greater than a heat capacity of said top piece.

13. The plasma processing system of claim 1, wherein said top piece further comprises a recess portion associated with a reduced heat capacity that is greater than or equal to 400% of a heat capacity of said top piece.

14. The plasma processing system of claim 1, further comprising a dielectric window disposed between said induction coil and said top piece for protecting said induction coil from said plasma at least a portion of said top piece being disposed between said heating and cooling system and said dielectric window.

15. The plasma processing system of claim 1, wherein a portion of said top piece is positioned between said induction coil and said heating and cooling system.

16. A plasma processing system for processing a substrate, the plasma processing system comprising:
   a bottom piece enclosing a chuck configured for holding said substrate:
   an induction coil configured to generate an electromagnetic field in order to create a plasma for processing said substrate;
   a heating and cooling system; and
   a top piece coupled to said bottom piece, said top piece comprising a first shelf, a second shelf and a wall; said wall being disposed between said first shelf and said second shelf; said first shelf being connected to said wall at a junction; said first shelf said second shelf, and said wall forming a cavity between said first shelf and said second shelf; said heating and cooling system being disposed inside said cavity; said heating and cooling system being further disposed at said junction;

wherein said heating and cooling system is substantially shielded from said electromagnetic field by said top piece.

17. The plasma processing system of claim 16, further comprising a cover covering said induction coil and at least partially covering said top piece, wherein said heating and cooling system is further disposed between said wall and a portion of said cover.

18. The plasma processing system of claim 16, wherein said cover is coupled to said bottom piece through said second shelf.

19. The plasma processing system of claim 16, wherein said cover covers said cavity.

20. The plasma processing system of claim 16, wherein said heating and cooling system surrounds at least a portion of said wall.

\* \* \* \* \*